(12) United States Patent
Ahn et al.

(10) Patent No.: US 11,650,752 B2
(45) Date of Patent: May 16, 2023

(54) COMPUTING SYSTEM AND OPERATING METHOD THEREOF

(71) Applicant: SK hynix Inc., Icheon-si (KR)

(72) Inventors: Nam Young Ahn, Icheon-si (KR); Yong Tag Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 69 days.

(21) Appl. No.: 17/313,868

(22) Filed: May 6, 2021

(65) Prior Publication Data

US 2022/0137859 A1 May 5, 2022

(30) Foreign Application Priority Data

Oct. 30, 2020 (KR) ........................ 10-2020-0143524

(51) Int. Cl.
*G06F 3/06* (2006.01)
*G11C 29/44* (2006.01)
(Continued)

(52) U.S. Cl.
CPC .......... *G06F 3/0655* (2013.01); *G06F 3/0619* (2013.01); *G06F 3/0653* (2013.01);
(Continued)

(58) Field of Classification Search
CPC ........ G06F 11/04; G06F 11/07; G06F 11/772; G06F 11/787; G06F 11/10;
(Continued)

(56) References Cited

U.S. PATENT DOCUMENTS 10,437,669 B2 * 10/2019 Laity .................... G06F 11/1068
2014/0317460 A1 * 10/2014 Kleveland .............. G11C 29/42
714/710
(Continued)

FOREIGN PATENT DOCUMENTS

KR 20090015506 A 2/2009
KR 101425958 B1 8/2014
(Continued)

*Primary Examiner* — Reginald G Bragdon
*Assistant Examiner* — Curtis James Kortman
(74) *Attorney, Agent, or Firm* — Perkins Coie LLP (57) ABSTRACT

A computing system includes: a memory device including a memory cells; a memory controller configured to control the memory device; and a host configured to detect an occurrence of an error in a first memory cell of the memory device while performing an operation corresponding to a workload and transmit, to the memory controller, a target address corresponding to the first memory cell and a request for a test operation on adjacent memory cells that are adjacent to the first memory cell. The memory controller controls the memory device to perform the test operation on the adjacent memory cells by using at least one of a Built-In Self-Test (BIST) engine or a scrub engine based on the target address and generate memory error information including information associated with a second memory cell in which the error occurs, the second memory cell being one of the adjacent memory cells. The host controls an access to the second memory cell based on the memory error information.

20 Claims, 9 Drawing Sheets (51) Int. Cl.
*G11C 29/12* (2006.01)
*G11C 29/42* (2006.01)

(52) U.S. Cl.
CPC ............ *G06F 3/0679* (2013.01); *G11C 29/12* (2013.01); *G11C 29/42* (2013.01); *G11C 29/44* (2013.01)

(58) Field of Classification Search
CPC ............ G06F 11/1044; G06F 11/2017; G06F 11/27–277; G06F 2201/86; G06F 2212/1032; G06F 3/604; G06F 3/619; G06F 3/653; G06F 3/655; G06F 3/658; G06F 3/679; G06F 10/1015; G06F 11/1028; G11C 11/4093; G11C 11/4096; G11C 11/5642; G11C 16/26; G11C 16/3418; G11C 16/3427; G11C 16/3431; G11C 2029/409; G11C 2029/411; G11C 2211/4062; G11C 29/12; G11C 29/42; G11C 29/44; G11C 29/4401; G11C 29/52
See application file for complete search history.

(56) References Cited

U.S. PATENT DOCUMENTS

| | | | |
|---|---|---|---|
| 2017/0139641 A1* | 5/2017 | Cha | G06F 11/106 |
| 2021/0064462 A1* | 3/2021 | Eun | G11C 29/4401 |
| 2021/0065835 A1* | 3/2021 | Jung | G11C 11/4085 |
| 2021/0208984 A1* | 7/2021 | Bueb | G06F 11/141 |

FOREIGN PATENT DOCUMENTS

| | | |
|---|---|---|
| KR | 101468432 B1 | 12/2014 |
| KR | 20170023439 A | 3/2017 |

* cited by examiner

COMPUTING SYSTEM AND OPERATING METHOD THEREOF

CROSS-REFERENCE TO RELATED APPLICATION

This patent document claims priority to and benefits of the Korean patent application number 10-2020-0143524, filed on Oct. 30, 2020, which is incorporated herein by reference in its entirety.

TECHNICAL FIELD

The technology and implementations disclosed in this patent document generally relates to an electronic device, and more particularly, to a computing system and an operating method thereof.

BACKGROUND

Storage devices refer to electronic components that are configured to store data on a permanent or temporary basis. Each storage device may include one or more storage medium to store data and operate based on a request from a host device which includes a processor that reads data from or writes data into the storage device such as a computer or a smart phone. The storage device may include a storage medium for storing data and may further include a memory controller for controlling the storage medium to store or retrieve data. The storage device can be classified based on the type of storage medium. For example, the memory device used as a storage medium is classified into a volatile memory device and a nonvolatile memory device.

A volatile memory device may store data only when power is supplied. Thus, such a volatile memory device loses its data in the absence of power. Examples of the volatile memory device include a Static Random Access Memory (SRAM) or Dynamic Random Access Memory (DRAM).

A nonvolatile memory device can retain its data in the absence of power. Examples of the nonvolatile memory device include a Read Only Memory (ROM), a Programmable ROM (PROM), an Electrically Programmable ROM (EPROM), an Electrically Erasable ROM (EEROM), or a flash memory.

SUMMARY

Embodiments provide a computing system capable of blocking, in advance, access to a memory cell in which an error occurs, and an operating method of the computing system.

In accordance with an aspect of the disclosed technology, there is provided a computing system including: a memory device including a plurality of memory cells for storing data; a memory controller in communication with the memory device and configured to control the memory device; and a host in communication with the memory controller with respect to reading or writing data in the memory device and configured to detect an occurrence of an error in a first memory cell of the memory device while performing an operation corresponding to a workload and transmit, to the memory controller, i) a target address corresponding to the first memory cell and ii) a request for a test operation on adjacent memory cells that are adjacent to the first memory cell; and wherein the memory controller is further configured to control the memory device to perform the test operation on the adjacent memory cells by using at least one of a Built-In Self-Test (BIST) engine or a scrub engine based on the target address and generate memory error information including information associated with a second memory cell in which the error occurs, the second memory cell being one of the adjacent memory cells, and wherein the host is further configured to control an access to the second memory cell based on the memory error information.

In accordance with another aspect of the disclosed technology, there is provided a method for operating a computing system including: detecting, by a host in communication with a storage device including a memory device including one or more memory cells and a memory controller configured to control to the memory device, an error occurring in a first memory cell included in the memory device; setting an operation mode of the host as a system management mode; transmitting, to the memory controller, a target address corresponding to the first memory cell and a request for a test operation on adjacent memory cells that are adjacent to the first memory cell; receiving, from the memory controller, memory error information that is based on a result of the test operation and including information associated with a second memory cell in which the error occurs, the second memory cell being one of the adjacent memory cells; and activating or deactivating an access to the second memory cell based on the memory error information.

In accordance with another aspect of the disclosed technology, there is provided a data storage device including: a memory device including a plurality of memory cells for storing data; a memory controller in communication with the memory device and configured to control the memory device, the memory controller configured to communicate with a host device outside the data storage device to receive from the host device, information on an occurrence of an error in a first memory cell of the memory device including a target address corresponding to the first memory cell and a request for a test operation on adjacent memory cells that are adjacent to the first memory cell, and wherein the memory controller is configured to control the memory device to perform the test operation on the adjacent memory cells based on the target address and generate memory error information including information associated with a second memory cell in which the error occurs, the second memory cell being one of the adjacent memory cells, and wherein the memory controller is configured to communicate the memory error information to the host device.

In some implementations, the memory controller may include a test operation controller configured to control the memory device to perform the test operation in response to the request for the test operation; and an error information storage configured to store the memory error information. In some implementations, the test operation controller may store data that has been stored in the adjacent memory cells in empty memory cells among the plurality of memory cells. In some implementations, the test operation controller may control the test operation by using at least one of a Built-In Self-Test (BIST) engine or a scrub engine. In some implementations, the test operation controller may carry out the test operation using the BIST engine includes an operation of programming test data to the adjacent memory cells, reading data from the programmed memory cells, and comparing the test data with the read data. In some implementations, the test operation controller may control the test operation by using the scrub engine and the test operation includes reading data from the adjacent memory cells, and detecting an error of the read data by using an Error Correction Code (ECC). In some implementations, the memory error information may include information on a type of the error and address information including an address of the second memory cell.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural features or functions disclosed herein are merely illustrative examples for specific embodiments or implementations of the disclosed technology and implementations of the disclosed technology are not limited to those specific examples.

Figure 1:
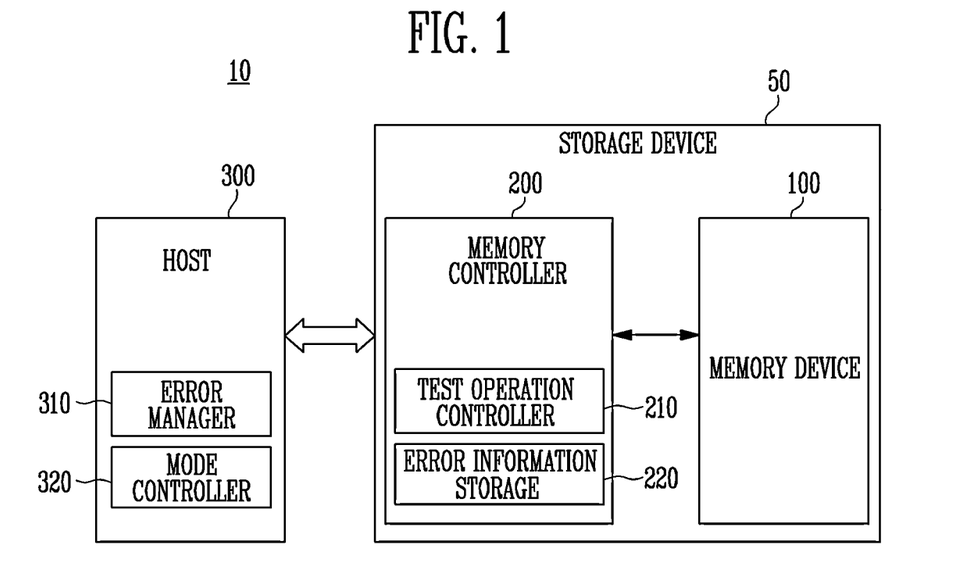
FIG. 1 is a diagram illustrating a computing system in accordance with an embodiment of the disclosed technology.

FIG. 1 is a diagram illustrating a computing system in accordance with an embodiment of the disclosed technology.

Referring to FIG. 1, the computing system 10 may include a storage device 50 and a host 300.

The storage device 50 may include a memory device 100 and a memory controller 200 for controlling an operation of the memory device 100. The storage device 50 may be a device for storing data under the control of the host 300. The host 300 is coupled in communication with the memory controller with respect to reading or writing data in the memory device and includes one or more processors as a computing device, such as a mobile phone, a smart phone, an MP3 player, a laptop computer, a desktop computer, a game console, a smart TV, a tablet PC or an in-vehicle infotainment system.

The memory device 100 may store data. The memory device 100 operates under the control of the memory controller 200. The memory device 100 may include a plurality of banks for storing data. Each of the plurality of banks may include a memory cell array (not shown) including a plurality of memory cells.

Each of the memory cells may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

The memory device 100 may be a volatile random access memory such as a Dynamic Random Access Memory (DRAM), a Synchronous RAM (SDRAM), a Double Data Rate SDRAM (DDR SDRAM), a DDR2 SDRAM, a DDR3 SDRAM, a Low Power DDR (LPDDR) SDRAM, or an LPDDR2 SDRAM, or an LPDDR3 SDRAM. In this specification, for convenience of description, a case where the memory device 100 is a DRAM is assumed and described.

The memory device 100 may receive a command CMD and an address ADDR from the memory controller 200, and access an area selected by the address ADDR in the memory cell array. The memory device 100 may perform an operation indicated by the command CMD on the area selected by the address ADDR. For example, the memory device 100 may perform a write operation (program operation), a read operation, and an erase operation. In the program operation, the memory device 100 may program data in the area selected by the address ADDR. In the read operation, the memory device 100 may read data from the area selected by the address ADDR. In the erase operation, the memory device 100 may erase data stored in the area selected by the address ADDR.

The memory controller 200 may control overall operations of the storage device 50.

When power is applied to the storage device 50, the memory controller 200 may execute firmware (FW).

In an embodiment, the memory controller 200 may receive data and a Logical Block Address (LBA) from the host 300, and translate the LBA into a Physical Block Address (PBA) representing addresses of memory cells included in the memory device 100, in which data is to be stored. The LBA may be referred to as a "logic address" or "logical address." The PBA may be referred to as a "physical address."

The memory controller 200 may control the memory device 100 to perform a program operation, a read operation, an erase operation, or others in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may control at least two memory devices 100. In some implementations, the memory controller 200 may control the memory devices based on an interleaving technique so as to improve operational performance. The interleaving technique may allow to control operations on at least two memory devices 100 to overlap with each other.

The host 300 may request the storage device 50 to store data ("original data") in the storage device 50. In response to the request from the host 300 to store the original data, the memory controller 200 may perform an error correction encoding on the original data and generate an Error Correction Code (ECC) for error correction. The memory controller may generate write data including the Error Correction Code (ECC) and control the memory device 100 to store the write data in the memory device 100.

The host 300 may send a read request to the storage device 50. The read request provided from the host 300 requests the storage device 50 to provide the host 300 with original data that has been stored in the storage device 50 based on the write request from the host 300. In response to the read request from the host 300, the memory controller 200 may provide the memory device 100 with a read command and a physical address representing positions of memory cells from which data to be read is stored so as to acquire, from the memory device 100, data corresponding to the read request from the host 300.

The memory device 100 may perform a read operation by using a default read voltage. A read voltage may be applied to identify data stored in a memory cell. The default read voltage may be determined through a test in a manufacturing process of the memory device 100.

The memory device 100 may provide the memory controller 200 with read data obtained by reading the data stored at the received physical address by using the default read voltage. The memory controller 200 may perform error correction decoding on the read data.

The error correction decoding may be an operation of acquiring original data by correcting an error bit included in the read data. It can be determined whether the error correction decoding has succeeded or failed based on whether a number of error bits included in the read data is equal to or smaller than that of correctable error bits. When the number of error bits included in the read data is equal to or smaller than that of correctable error bits, the error correction decoding may succeed. On the contrary, when the number of error bits included in the read data exceeds that of correctable error bits, the error correction decoding may fail. When the error correction decoding passes, original data corresponding to the logical address included in the read request from the host 300 may be acquired. Therefore, when the error correction decoding passes, the read operation can be successfully performed. When the error correction decoding fails, the original data cannot be acquired, and the read operation performed by the memory device 100 fails.

The computing system 10 may detect an error on a specific memory area during a workload operation through analysis techniques such as a Predictive Failure Analysis (PFA) technique. Once the host 300 detects the error for the specific memory area, the host 300 may send related information including an address of the specific memory area to the storage device 50. The workload operation in a computing device may refer to any operation that uses computing resources to perform a certain task and, in the context of a data storage device, a workload operation is a data storage operation such as reading or writing data. Upon the detection of the error on the specific memory area during the workload operation, the computing system 10 limits access to the corresponding specific memory area. The current prediction of errors during the workload operation, however, is only about that specific memory area corresponding to the workload operation, and does not detect an error from another memory area which is not related to the workload operation. Therefore, there are still possible that an Uncorrectable Error (UE) can occur in the computing system 10 when accessing to other memory areas than the specific memory area from which the host 300 can detect an error based on prediction techniques such as a PFA.

Thus, some implementations of the disclosed technology suggest technologies for detecting an error from memory cells that are adjacent to a specific memory cell corresponding to the workload operation. Thus, in accordance with the embodiment of the disclosed technology, the computing system 10 detects an error on adjacent memory cells as well during a workload operation of the host 300. Thus, the occurrence of an UE can be prevented by blocking, in advance, access to a memory area in which the error occurs.

In an embodiment, the memory controller 200 may receive, from the host 300, a target address corresponding to a memory cell in which an error occurs. The memory controller 200 may receive a request to perform a test operation to determine whether an error has been occurred on any memory cells adjacent to a memory cell corresponding to the target address received from the host 300. The memory controller 200 may control the memory device 100 to perform the test operation based on the target address.

In an embodiment, the memory controller 200 may include a test operation controller 210 and an error information storage 220.

The test operation controller 210 may control the test operation in response to a request from the host 300.

In an embodiment, the test operation controller 210 may control the test operation on memory cells adjacent to a memory cells in which an error occurs.

In an embodiment, the test operation controller 210 may control the test operation by using at least one of a Built-In Self-Test (BIST) engine and a scrub engine.

The BIST engine may be included in the memory controller 200. In an embodiment, the test operation using the BIST engine may include an operation of programming test data to adjacent memory cells, read data from the memory cells in which the test data has been programmed, and comparing the test data with the read data. The test operation controller 210 may determine whether an error of the adjacent memory cells has occurred based on a result obtained by comparing the test data with the read data.

The scrub engine may be included in at least one of the memory controller 200 and the memory device 100. The test operation using the scrub engine may include an operation of reading data from adjacent memory cells and detecting an error of the read data by using an error correction code. The test operation controller 210 may determine whether an error of the adjacent memory cells has occurred based on an error detection operation using the error correction code.

In an embodiment, the test operation controller 210 may generate memory error information including information associated with memory cells in which the error occurs among the adjacent memory cells, based on a result obtained by performing the test operation.

In an embodiment, the memory error information may include error type information including information on a type of the error and address information including an address of the memory cells in which the error occurs.

The type of the error may include a single bit error occurring in a single bit unit, a row error occurring in a row unit, a multi-row error occurring in a multi-row unit, and a column error occurring in a column unit.

The single bit error may mean a case where one or less error occurs in the same word line or the same bit line. The row error may mean a case where at least two errors occurring in the memory device 100 occur at the same row address in the same bank. The multi-row error may mean a case where at least two row errors occur in the same bank. The column error may mean a case where at least two errors occurring in the memory device 100 occur at the same column address.

The test operation controller 210 may generate the error type information by selecting one of the single bit error, the row error, the multi-row error, and the column error, based on the result obtained by the performing the test operation.

The address information may include a bank address, a row address, and a column address of the memory cells in which the error occurs.

In an embodiment, the test operation controller 210 may provide the memory error information to the host 300 based on a request from the host 300.

The error information storage 220 may store the memory error information.

The host 300 may provide the storage device 50 with an operation request such as a write request, a read request, or an erase request for a plurality of memory cells based on a workload.

In an embodiment, the host may include an error manager 310 and a mode controller 320. The error manager 310 and the mode controller 320 may be firmware included in a BIOS (not shown).

The error manager 310 may include error monitoring software.

In an embodiment, the error manger 310 may detect an error occurring in the memory device 100, while an operation corresponding to the workload is being performed. In an embodiment, when an error is detected, the error manager 310 may provide the memory controller 200 with a target address corresponding to a memory cell in which the error occurs. Also, the error manager 310 may request the test operation on memory cells adjacent to the memory cells in which the error occurs. Subsequently, the error manager 310 may request memory error information, and receive the memory error information from the memory controller 200.

In an embodiment, the error manager 310 may control access to the memory cells in which the error occurs, based on the memory error information. For example, the error manager 310 may deactivate the access to the memory cells in which the error occurs, based on the memory error information. Specifically, the error manager 310 may deactivate the access to the memory cells in which the error occurs, based on information on a type of the error and an address of the memory cells in which the error occurs. Also, the error manager 310 may provide the memory controller 200 with a request for an off-lining operation on the memory cells in which the error occurs.

The mode controller 320 may set an operation mode of the host 300. For example, the operation mode of the host 300 may include a normal operation mode, a System Management Mode (SMM), or others. The normal operation mode may mean a mode in which an operating system (not shown) included in the host performs an operation corresponding to the workload. The SMM may mean a mode for allowing access to all memory areas included in the memory device 100 for handing system-wide functions like power management, system hardware control, or others but limiting operations of the operating system.

Figure 2:
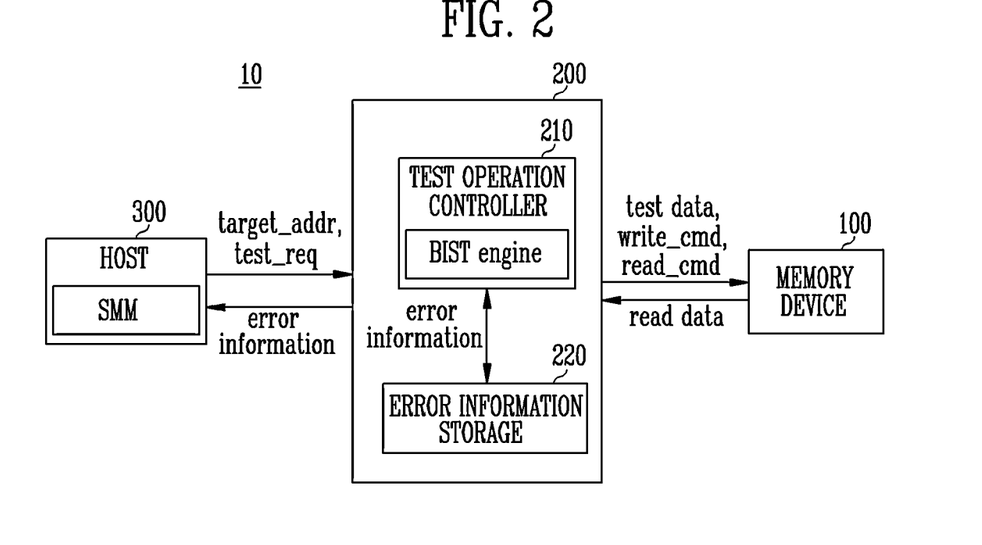
FIG. 2 is a diagram illustrating an example of a test operation in accordance with an embodiment of the disclosed technology.
Figure 3:
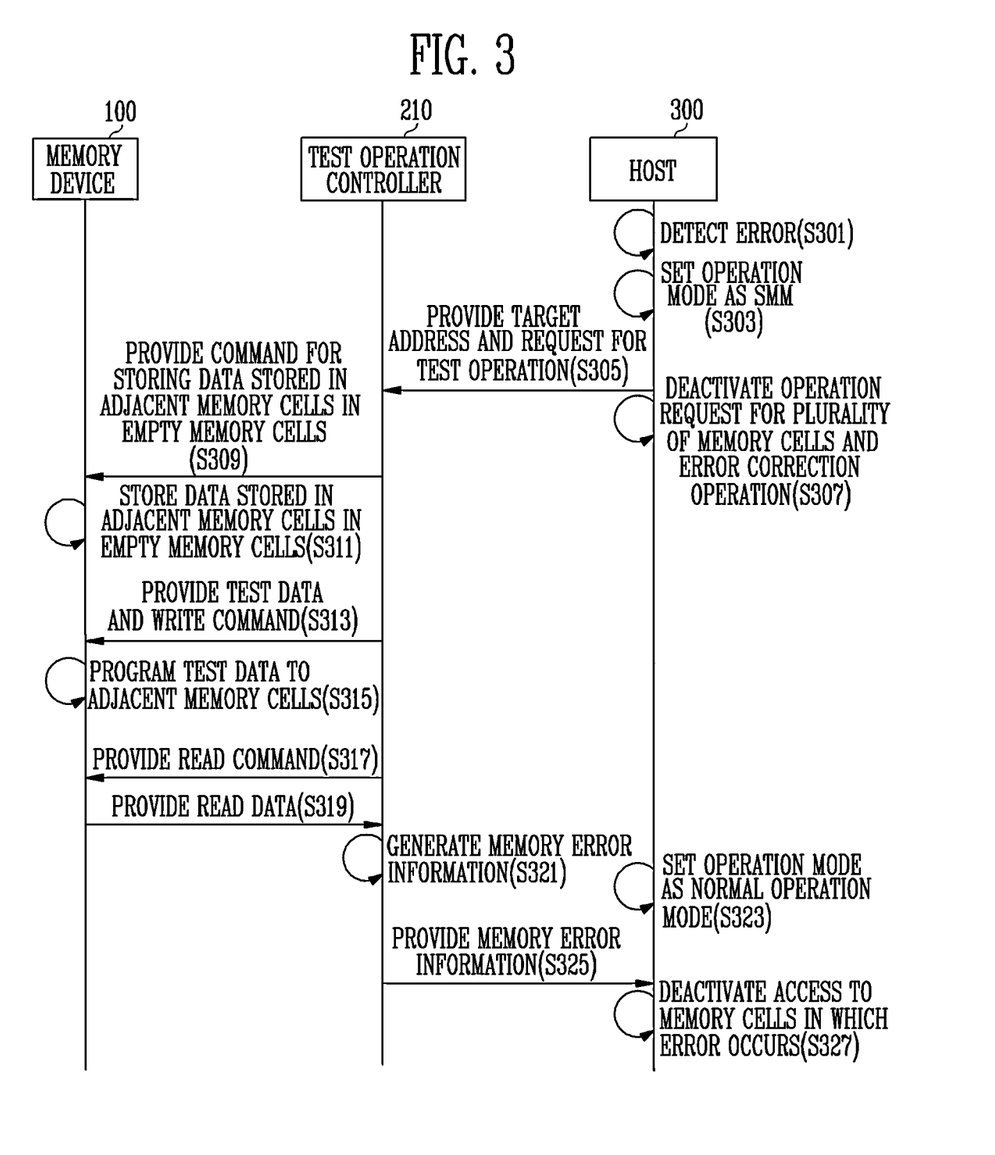
FIG. 3 is a flowchart illustrating the example of the test operation in accordance with an embodiment of the disclosed technology.

FIG. 2 is a diagram illustrating an example of a test operation in accordance with an embodiment of the disclosed technology. FIG. 3 is a flowchart illustrating the example of the test operation in accordance with an embodiment of the disclosed technology.

FIGS. 2 and 3 are diagrams illustrating an example in which the test operation is performed by using a BIST engine included in the memory controller 200. Therefore, in FIGS. 2 and 3, it is assumed that the memory controller 200 includes the BIST engine.

Referring to FIGS. 2 and 3, the host 300 may detect an error on a specific memory cell while the host 300 is performing an operation corresponding to a workload (S301).

Subsequently, the host 300 may set an operation mode as a system management mode (SMM) (S303).

Subsequently, the host 300 may provide the memory controller 200 with a target address target_addr corresponding to the memory cell in which the error occurs and a request test_req for a test operation on memory cells adjacent to the memory cell in which the error occurs (S305).

In an embodiment, the host 300 may deactivate an operation request for a plurality of memory cells and an error correction operation (S307).

In an embodiment, the test operation controller 210 may control the memory device 100 to store data stored in the adjacent memory cells in empty memory cells among the plurality of memory cells.

Specifically, the test operation controller 210 may provide the memory device 100 with a command for storing the data stored in the adjacent memory cells in empty memory cells among the plurality of memory cells (S309).

The memory device 100 may store the data stored in the adjacent memory cells in the empty memory cells among the plurality of memory cells (S311).

In an embodiment, the test operation controller 210 may control the test operation on the adjacent memory cells by using the BIST engine, based on the target address target_addr.

In some implementations, the test operation controller 210 may provide the memory device 100 with test data and a write command write_cmd for programming the test data to the adjacent memory cells (S313).

The memory device 100 may program the test data to the adjacent memory cells based on the write command write_cmd (S315).

Subsequently, the test operation controller 210 may provide the memory device 100 with a read command read_cmd for reading data from the memory cells to which the test data is programmed (S317).

The memory device 100 may provide the read data to the memory controller 200 based on the read command read_cmd (S319).

Subsequently, the test operation controller 210 may generate memory error information (error information), based on a result obtained by comparing the test data test data with the read data (S321). In an embodiment, when a type of the error is determined as a single bit error, the test operation controller 210 may suspend the test operation. The error information storage 220 may store the memory error information error information generated by the test operation controller 210.

When the test operation of the test operation controller 210 is ended, the host 300 may set the operation mode as a normal operation mode (S323).

The test operation controller 210 may provide the memory error information error information to the host 300 (S325).

The host 300 may deactivate access to the memory cells in which the error occurs, based on the memory error information error information (S327).

Figure 4:
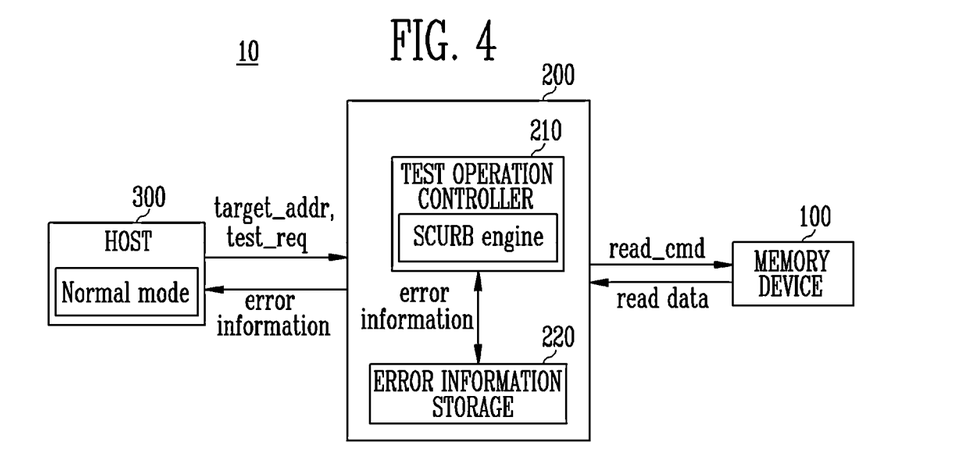
FIG. 4 is a diagram illustrating another example of the test operation in accordance with an embodiment of the disclosed technology.
Figure 5:
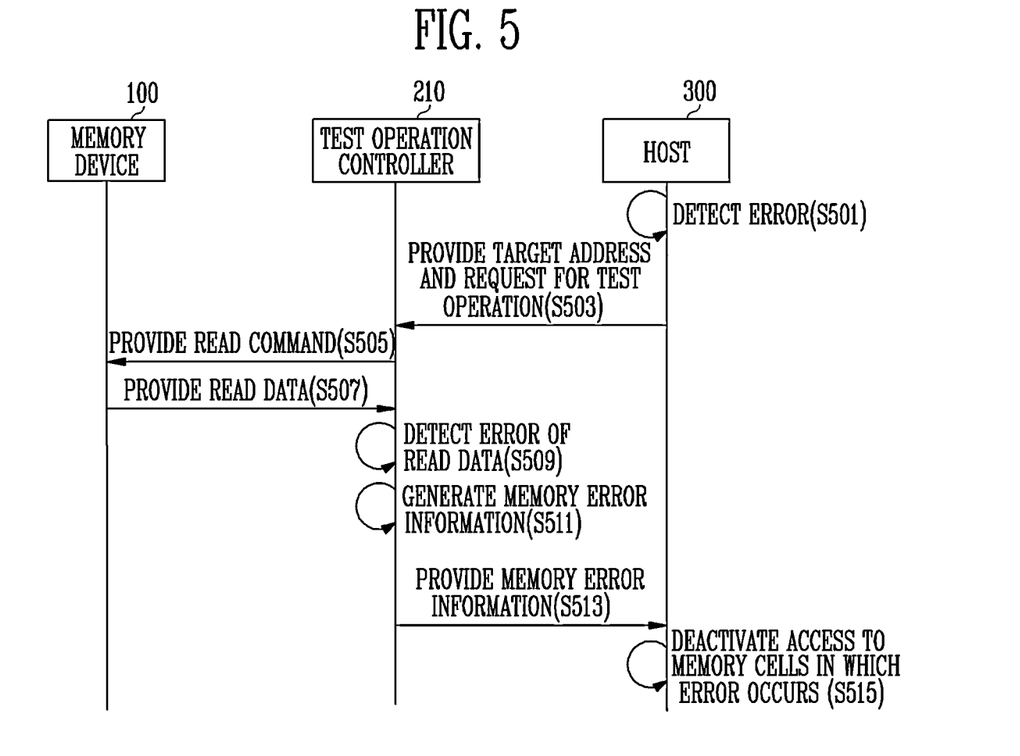
FIG. 5 is a flowchart illustrating the another example of the test operation in accordance with an embodiment of the disclosed technology.

FIG. 4 is a diagram illustrating another example of the test operation in accordance with an embodiment of the disclosed technology. FIG. 5 is a flowchart illustrating another example of the test operation in accordance with an embodiment of the disclosed technology.

FIGS. 4 and 5 are diagrams illustrating an example in which the test operation is performed by using a SCRUB engine included in the memory controller 200. Therefore, in FIGS. 4 and 5, it is assumed that the memory controller 200 includes the SCRUB engine. Also, in FIGS. 4 and 5, the operation mode of the host 300 may be a normal operation mode Normal mode.

Referring to FIGS. 4 and 5, the host 300 may detect an error on a specific memory cell while the host 300 performs an operation corresponding to a workload (S501).

Subsequently, the host 300 may provide the memory controller 200 with a target address target_addr corresponding to the memory cell in which the error occurs and a request test_req for a test operation on memory cells adjacent to the memory cell in which the error occurs (S503).

In an embodiment, the test operation controller 210 may control the test operation on the adjacent memory cells by using the SCRUB engine included in the memory controller 200, based on the target address.

The test operation controller 210 may provide the memory device 100 with a read command read_cmd for reading data from the adjacent memory cells (S505).

The memory device 100 may provide the memory controller 200 with read data according to the read command read_cmd (S507).

Subsequently, the test operation controller 210 may detect an error of the read data by using an error correction code (S509).

Subsequently, the test operation controller 210 may generate memory error information (error information), based on a result obtained by detecting the error (S511). In an embodiment, when a type of the error is determined as a single bit error, the test operation controller 210 may suspend the test operation. The error information storage 220 may store the memory error information error information generated by the test operation controller 210.

The test operation controller 210 may provide the memory error information error information to the host 300 (S513).

The host 300 may deactivate access to the memory cells in which the error occurs, based on the memory error information error information (S515).

Figure 6:
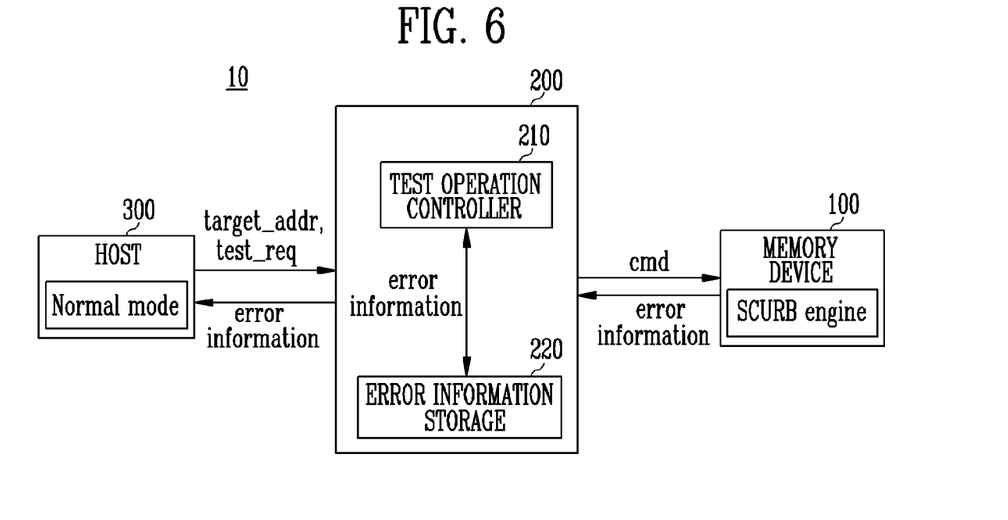
FIG. 6 is a diagram illustrating still another example of the test operation in accordance with an embodiment of the disclosed technology.
Figure 7:
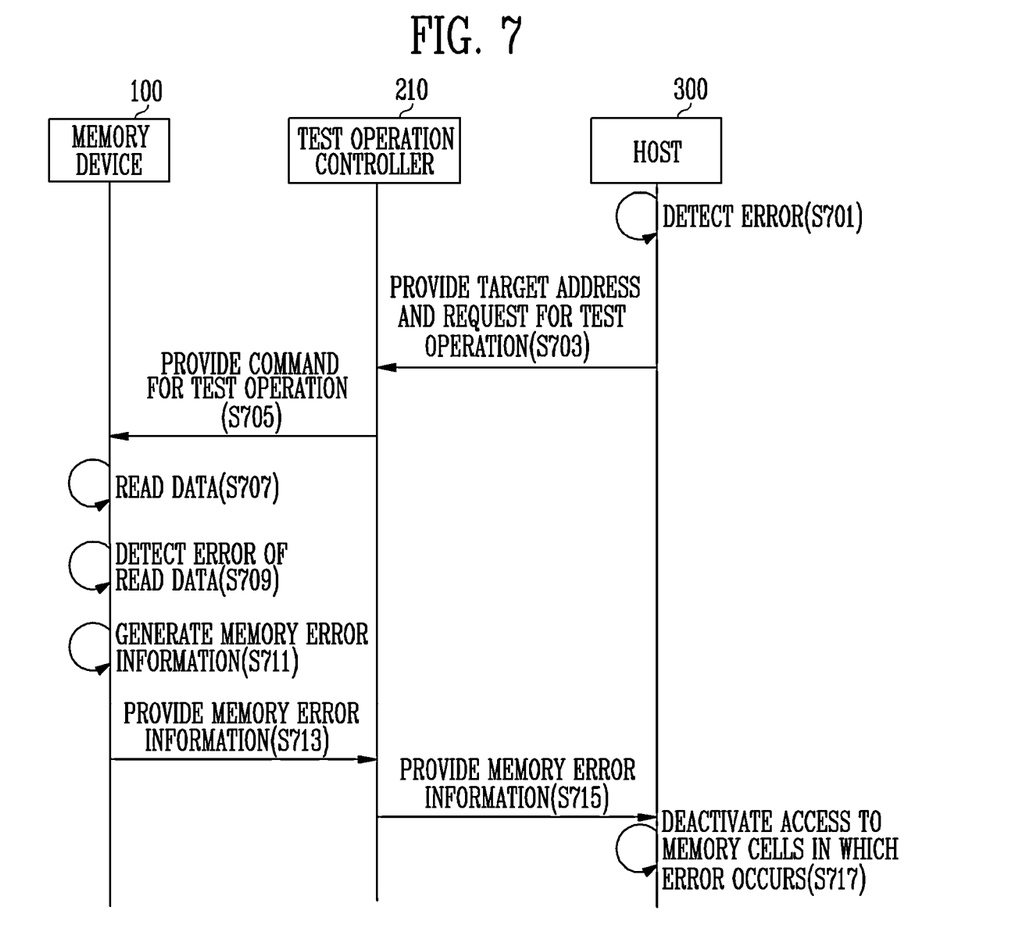
FIG. 7 is a flowchart illustrating the still another example of the test operation in accordance with an embodiment of the disclosed technology.

FIG. 6 is a diagram illustrating still another example of the test operation in accordance with an embodiment of the disclosed technology. FIG. 7 is a flowchart illustrating the still another example of the test operation in accordance with an embodiment of the disclosed technology.

Specifically, FIGS. 6 and 7 are diagrams illustrating an example in which the test operation is performed by using a SCRUB engine included in the memory controller 200. Therefore, in FIGS. 6 and 7, it is assumed that the memory controller 200 includes the SCRUB engine. Also, in FIGS. 6 and 7, the operation mode of the host 300 may be a normal operation mode Normal mode.

Referring to FIGS. 6 and 7, the host 300 may detect an error on a specific memory cell while the host 300 is performing an operation corresponding to a workload (S701).

Subsequently, the host 300 may provide the memory controller 200 with a target address target_addr corresponding to the memory cell in which the error occurs and a request test_req for a test operation on memory cells adjacent to the memory cell in which the error occurs (S703).

In an embodiment, the test operation controller 210 may control the test operation on the adjacent memory cells by using the SCRUB engine included in the memory controller 200, based on the target address.

In some implementations, the test operation controller 210 may provide the memory device 100 with a command cmd for performing the test operation on the adjacent memory cells (S705).

The memory device 100 may read data from the adjacent memory cells according to the command cmd (S707), and detect an error of the read data by using an error correction code (S709).

Subsequently, the memory device 100 may generate memory error information (error information), based on a result obtained by detecting the error (S711). In an embodiment, when a type of the error is determined as a single bit error, the memory device 100 may suspend the test operation.

The memory device 100 may provide the memory error information error information to the memory controller 200 (S713). The error information storage 220 may store the memory error information error information provided from the memory device 100.

The test operation controller 210 may provide the memory error information error information to the host 300 (S715).

The host 300 may deactivate access to the memory cells in which the error occurs, based on the memory error information error information (S717).

Figure 8:
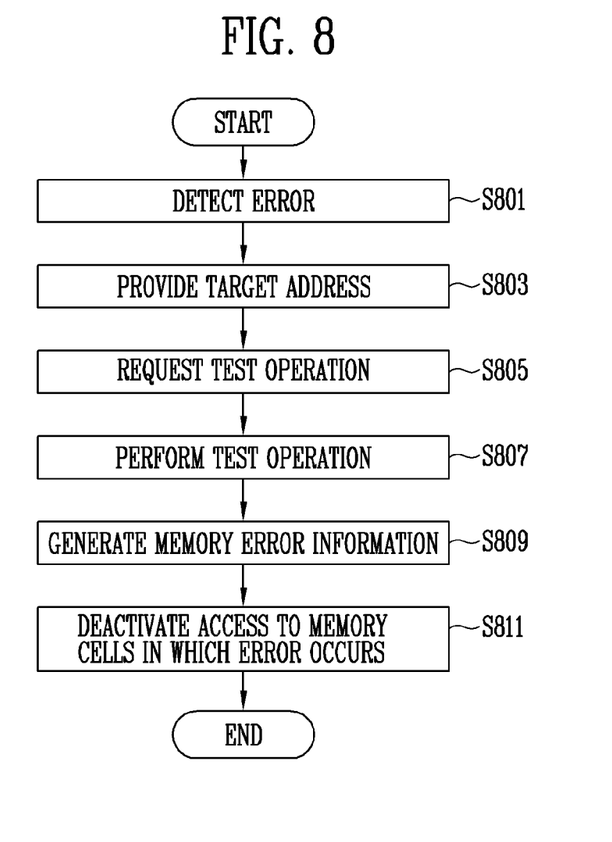
FIG. 8 is a flowchart illustrating an operating method of a computing system in accordance with an embodiment of the disclosed technology.

FIG. 8 is a flowchart illustrating an operating method of a computing system in accordance with an embodiment of the disclosed technology.

The operating method shown in FIG. 8 may be performed by, for example, the computing system 10 shown in FIG. 1.

Referring to FIG. 8, in step S801, the computing system 10 may detect an error.

In step S803, the computing system 10 may provide the memory controller with a target address corresponding to a memory cell in which the error occurs.

In step S805, the computing system 10 may request the memory controller of a test operation for determining whether an error of memory cells adjacent the memory cell in which the error occurs among a plurality of memory cells has occurred.

In step S807, the computing system 10 may perform the test operation on the adjacent memory cells.

In step S809, the computing system 10 may generate memory error information representing a result obtained by performing the test operation.

In step S811, the computing system 10 may deactivate access to memory cells in which the error occurs among the adjacent memory cells, based on the memory error information.

Figure 9:
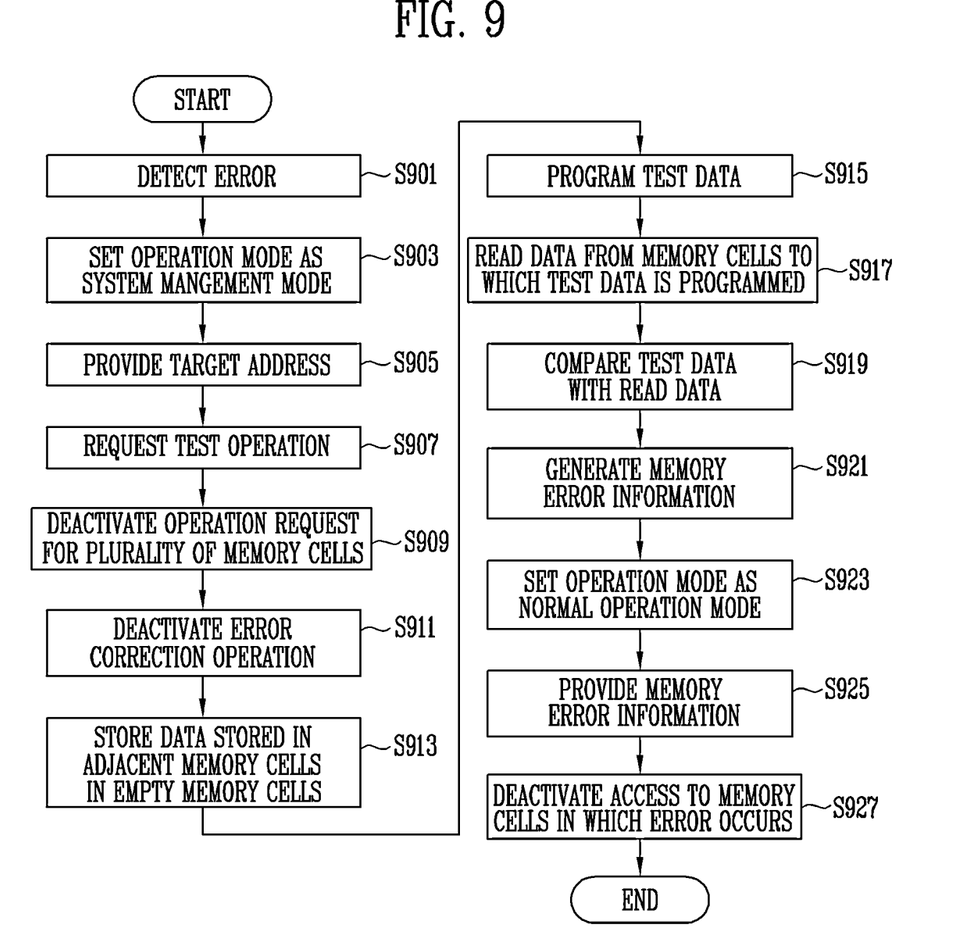
FIG. 9 is a flowchart illustrating an example of a method for performing a test operation in accordance with an embodiment of the disclosed technology.

FIG. 9 is a flowchart illustrating an example of a method for performing a test operation in accordance with an embodiment of the disclosed technology.

The method shown in FIG. 9 may be performed by, for example, the computing system 10 shown in FIG. 1.

In an embodiment, the method shown in FIG. 9 may be a method for performing a test operation by using a BIST engine included in the memory controller.

Referring to FIG. 9, in step S901, the computing system 10 may detect an error.

In step S903, the computing system 10 may set the operation mode of the host as a system management mode.

In step S905, the computing system 10 may provide the memory controller with a target address corresponding to a memory cell in which the error occurs.

In step S907, the computing system 10 may request the memory controller of a test operation for determining whether an error of memory cells adjacent to the memory cell in which the error occurs among a plurality of memory cells has occurred.

In step S909, the computing system 10 may deactivate an operation request for the plurality of memory cells except the request for the test operation.

In step S911, the computing system 10 may deactivate an error correction operation.

In step S913, the computing system 10 may store data stored in the adjacent memory cells in empty memory cells among the plurality of memory cells.

In step S915, the computing system 10 may program test data to the adjacent memory cells.

In step S917, the computing system 10 may read data from the memory cells to which the test data is programmed.

In step S919, the computing system 10 may compare the test data with the read data.

In step S921, the computing system 10 may generate memory error information, based on a result obtained by comparing the test data with the read data.

In step S923, the computing system 10 may set the operation mode of the host as a normal operation mode.

In step S925, the computing system 10 may provide the memory error information to the host.

In step S927, the computing system 10 may deactivate access to memory cells in which the error occurs among the adjacent memory cells, based on the memory error information.

Figure 10:
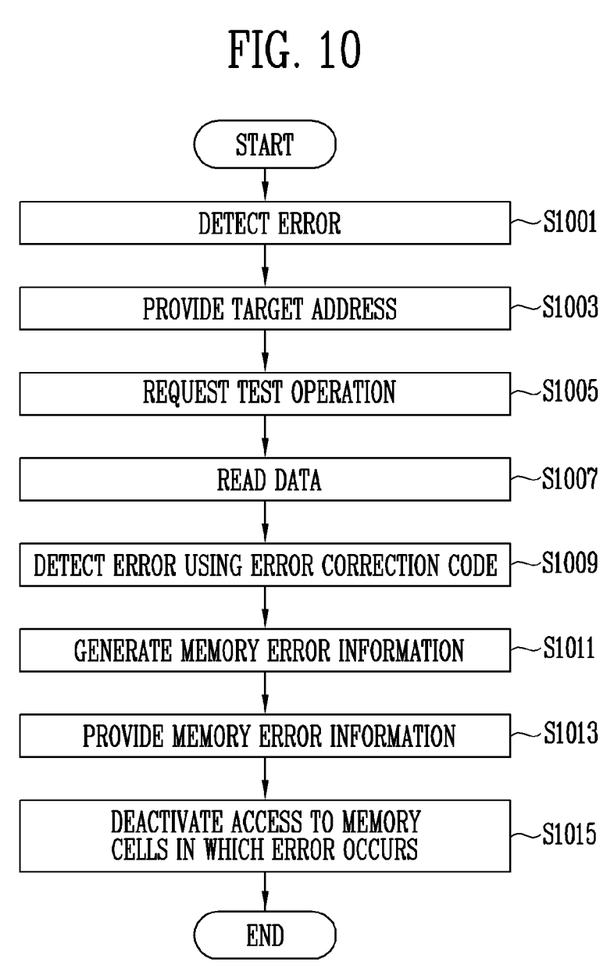
FIG. 10 is a flowchart illustrating another example of the method for performing the test operation in accordance with an embodiment of the disclosed technology.

FIG. 10 is a flowchart illustrating another example of the method for performing the test operation in accordance with an embodiment of the disclosed technology.

The method shown in FIG. 10 may be performed by, for example, the computing system 10 shown in FIG. 1.

In an embodiment, the method shown in FIG. 10 may be a method for performing a test operation by using a scrub engine included in at least one of the memory controller and the memory device.

Also, the method shown in FIG. 10 may be performed in a state in which the operation mode of the host is set as a normal operation mode.

Referring to FIG. 10, in step S1001, the computing system 10 may detect an error.

In step S1003, the computing system 10 may provide the memory controller with a target address corresponding to a memory cell in which the error occurs.

In step S1005, the computing system 10 may request the memory controller of a test operation for determining whether an error of memory cells adjacent to the memory cell in which the error occurs among a plurality of memory cells has occurred.

In step S1007, the computing system 10 may read data from the adjacent memory cells.

In step S1009, the computing system 10 may detect an error of the read data by using an error correction code.

In step S1011, the computing system 10 may generate memory error information, based on a result obtained by detecting the error.

In step S1013, the computing system 10 may provide the memory error information to the host.

In step S1015, the computing system 10 may deactivate access to memory cells in which the error occurs among the adjacent memory cells, based on the memory error information.

Figure 11:
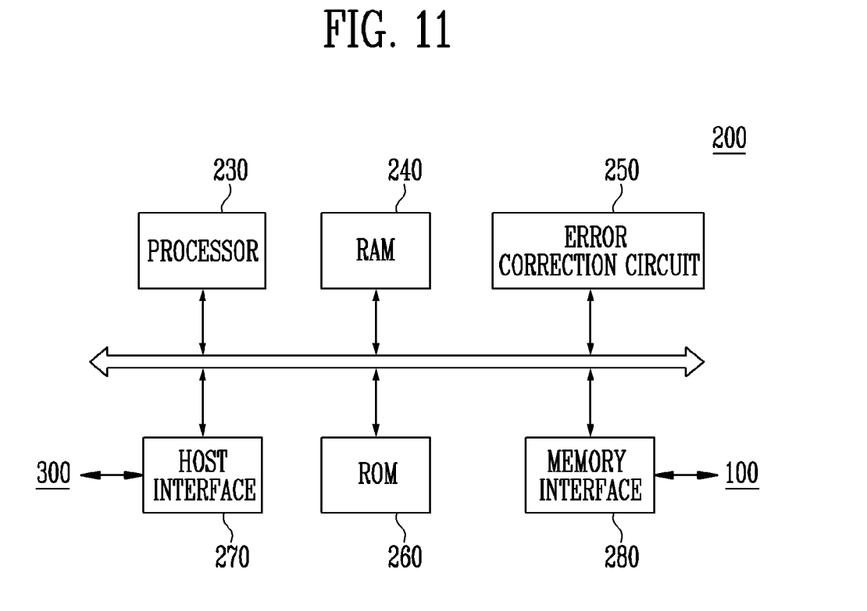
FIG. 11 is a diagram illustrating a memory controller shown in FIG. 1.

FIG. 11 is a diagram illustrating the memory controller shown in FIG. 1.

Referring to FIGS. 1 and 11, the memory controller 200 may include a processor 230, a RAM 240, an error correction circuit 250, ROM 260, a host interface 270, and a memory interface 280.

The processor 230 may control overall operations of the memory controller 200. The RAM 240 may be used as a buffer memory, a cache memory, a working memory, etc. of the memory controller 200.

The error correction circuit 250 may perform error correction. The error correction circuit 250 may perform ECC encoding, based on data to be written to the memory device through the memory interface 280. The ECC-encoded data may be transferred to the memory device through the memory interface 280. The error correction circuit 250 may perform ECC decoding on data received through the memory interface 280 from the memory device. Exemplarily, the error correction circuit 250 may be included as a component of the memory interface 280 in the memory interface 280.

The ROM 260 may store, in the form of firmware, various information required in an operation of the memory controller 200. In an example, the test operation controller 210 and the error information storage 220, which are shown in FIG. 1, may be firmware stored in the ROM 260.

The memory controller 200 may communicate with an external device (e.g., the host 300, an application processor, or the like) through the host interface 270.

The memory controller 200 may communicate with the memory device 100 through the memory interface 280. The memory controller 200 may transmit a command, an address, a control signal, and/or others to the memory device 100 through the memory interface 280, and receive data.

In accordance with the disclosed technology, there can be provided a computing system capable of blocking, in advance, access to a memory cell in which an error occurs, and an operating method of the computing system.

While the disclosed technology has been shown and described with reference to certain exemplary embodiments thereof, it will be understood by those skilled in the art that various changes in form and details may be made to the disclosed examples. Various modifications and enhancements of the disclosed embodiments and other embodiments can be made based on what is disclosed in this patent document.

What is claimed is:

1. A computing system, comprising:
a memory device including a plurality of memory cells for storing data;
a memory controller in communication with the memory device and configured to control the memory device; and a host in communication with the memory controller with respect to reading or writing data in the memory device and configured to detect an occurrence of an error in a first memory cell of the memory device while performing an operation corresponding to a workload and transmit, to the memory controller, i) a target address corresponding to the first memory cell and ii) a request for a test operation on adjacent memory cells that are adjacent to the first memory cell, wherein the memory controller is further configured to control the memory device to perform the test operation on the adjacent memory cells based on the target address, determine a second memory cell in which an error occurs based on a result of the test operation, the second memory cell being one of the adjacent memory cells, and generate memory error information including information associated with the second memory cell, and wherein the host is further configured to control an access to the second memory cell based on the memory error information.

2. The computing system of claim 1, wherein the memory controller includes:
a test operation controller configured to control the memory device to perform the test operation in response to the request for the test operation; and
an error information storage configured to store the memory error information.

3. The computing system of claim 2, wherein the test operation is performed according to commands stored in at least one of the memory controller and the memory device.

4. The computing system of claim 2, wherein the host is further configured to set its operation mode as a system management mode and transmit, to the test operation controller, the target address and the request for the test operation in the system management mode.

5. The computing system of claim 4, wherein the test operation controller is configured to store data that has been stored in the adjacent memory cells in empty memory cells among the plurality of memory cells.

6. The computing system of claim 4, wherein the host is further configured to deactivate an operation request for the plurality of memory cells except the request for the test operation and an error correction operation in the system management mode.

7. The computing system of claim 4, wherein the test operation includes an operation of programming test data to the adjacent memory cells, reading data from the programmed memory cells, and comparing the test data with the read data.

8. The computing system of claim 2, wherein the host is further configured to transmit, to the test operation controller, the target address and the request for the test operation in a normal operation mode.

9. The computing system of claim 8, wherein the test operation includes an operation of reading data from the adjacent memory cells, and detecting an error of the read data by using an Error Correction Code (ECC).

10. The computing system of claim 1, wherein the memory error information includes error type information including information on a type of the error and address information including an address of the second memory cell.

11. The computing system of claim 1, wherein the host is further configured to deactivate the access to the second memory cell based on the memory error information.

12. A method for operating a computing system, comprising:
detecting, by a host in communication with a storage device including a memory device including one or more memory cells and a memory controller configured to control to the memory device, an error occurring in a first memory cell included in the memory device;
setting an operation mode of the host as a system management mode;
transmitting, to the memory controller, a target address corresponding to the first memory cell and a request for a test operation on adjacent memory cells that are adjacent to the first memory cell;
determining a second memory cell in which an error occurs based on a result of the test operation, the second memory cell being one of the adjacent memory cells;
receiving, from the memory controller, memory error information including information associated with the second memory cell and
activating or deactivating an access to the second memory cell based on the memory error information.

13. The method of claim 12, wherein the transmitting of the target address and the request for the test operation is performed in the system management mode.

14. The method of claim 13, wherein the memory controller is configured to perform the test operation according to commands stored in at least one of the memory controller and the memory device.

15. The method of claim 14, further comprising, in response to the setting of the operation mode of the host as the system management mode:
deactivating i) an operation request for the one or more memory cells except the request for the test operation and ii) an error correction operation; and
storing data that has been stored in the adjacent memory cells in empty memory cells among the one or more memory cells.

16. The method of claim 15, wherein the memory controller is further configured to perform the test operation by performing:
programming test data to the adjacent memory cells;
reading data from the adjacent memory cells; and
comparing the test data with the read data.

17. The method of claim 14, wherein the memory controller is further configured to perform the test operation by performing:
reading data from the adjacent memory cells; and
detecting an error of the read data by using an Error Correction Code (ECC).

18. The method of claim 12, wherein the transmitting of the target address and the request for the test operation is performed in a normal operation mode of the host.

19. A data storage device comprising:
a memory device including a plurality of memory cells for storing data; and
a memory controller in communication with the memory device and configured to control the memory device, the memory controller being further configured to communicate with a host device outside the data storage device to receive from the host device, information on an occurrence of an error in a first memory cell of the memory device including a target address corresponding to the first memory cell and a request for a test operation on adjacent memory cells that are adjacent to the first memory cell, wherein the memory controller is further configured to control the memory device to perform the test operation on the adjacent memory cells based on the target address, and generate memory error information including information associated with a second memory cell in which an error occurs, the second memory cell being one of the adjacent memory cells, and wherein the memory controller is further configured to communicate the memory error information to the host device.

20. The data storage device of claim 19, wherein the memory controller is further configured to determine the second memory cell based on a result of the test operation.

\* \* \* \* \*